United States Patent [19]
Oh

[11] Patent Number: 6,075,822
[45] Date of Patent: Jun. 13, 2000

[54] TRACEBACK DEVICE OF A TRELLIS DECODER

[75] Inventor: Dae Il Oh, Kyongki-do, Rep. of Korea

[73] Assignee: Hyundai Electronics Industries, Co., Ltd., Rep. of Korea

[21] Appl. No.: 09/283,086

[22] Filed: Mar. 31, 1999

[30] Foreign Application Priority Data

Mar. 31, 1998 [KR] Rep. of Korea .................... 98-011314

[51] Int. Cl.[7] .................................................. H04L 23/02
[52] U.S. Cl. ...................... 375/262; 375/265; 375/270; 375/277; 375/341; 714/791; 714/792; 714/795; 714/794; 714/796; 371/43
[58] Field of Search .................................... 375/262, 265, 375/270, 277, 341; 332/167, 168, 169, 170; 714/791, 792, 794, 795, 796

[56] References Cited

U.S. PATENT DOCUMENTS

| | | | |
|---|---|---|---|
| 4,677,625 | 6/1987 | Betts et al. ................................. | 371/43 |
| 5,303,263 | 4/1994 | Shoji et al. ................................. | 375/11 |
| 5,684,832 | 11/1997 | Adachi et al. ............................ | 375/262 |
| 5,787,127 | 7/1998 | Ono et al. ................................. | 375/341 |
| 5,815,515 | 9/1998 | Dabiri ...................................... | 371/43.7 |
| 5,914,988 | 6/1999 | Hu et al. .................................. | 375/341 |
| 5,991,341 | 9/1998 | Shin ........................................ | 375/365 |

FOREIGN PATENT DOCUMENTS 0661840   7/1995   European Pat. Off. .

*Primary Examiner*—Stephen Chin
*Assistant Examiner*—Dac V. Ha
*Attorney, Agent, or Firm*—Saliwanchik, Lloyd & Saliwanchik

[57] ABSTRACT

A traceback device for grand Alliance 8 Vestigial Side Band using Viterbi decoding algorithm. The traceback device includes a control unit, traceback device and delaying unit, wherein the control unit generates an activating signal_1 to read survivor path stored value one time per four symbol data inputs and a reading address signal, while also generating an activating signal_2 to delay read survivor path stored value. The traceback device reads stored survivor path information according to the activating signal_1 and the address signal from the control unit and performs traceback based on the read survivor path information. The data-delaying unit sequentially delays decoded data from the traceback device up to the predetermined bit according to the activating signal_2 from the control unit to output one byte decoded data per one time traceback.

9 Claims, 7 Drawing Sheets

TRACEBACK DEVICE OF A TRELLIS DECODER

FIELD OF THE INVENTION

This invention relates to a system for receiving a standard digital transmission such as High Definition Television (HDTV), and, more particularly, to a traceback device for Grand Alliance 8 Vestigial Side Band (GA8 VSB) using Viterbi decoding algorithm.

BACKGROUND OF THE INVENTION

In a digital communication system, the received data may be corrupted by noise or distortion. Consequently, the digital data obtained at the receiving station may not be an accurate replica of the transmitted data. One form of error correction to reduce such errors includes encoding the transmitted data to add redundancy before transmission.

Redundancy may be introduced, for example, by increasing the symbol rate. More specifically, error checking and error correcting codes may be appended to fixed-length blocks of source data, and the combination may then be sent at a higher data rate. Signal-space codes may also be used to add redundancy by converting the source data into line code. One signal-space code which has enjoyed wide-spread acceptance because of its superior performance is the trellis code, a convolution code best explained using a trellis diagram.

The encoded transmitted data may be decoded using a Viterbi algorithm that is a highly effective decoding method. The Viterbi decoding algorithm was developed in 1967 and is an optimum decoding method for carrying out maximum likelihood decoding. By taking an example of a convolution encoder, a simple Viterbi decoding algorithm will be described with reference to FIG. 1. FIG. 1, shows a block structure of a general convolution encoder consisting of a 2-bit shift register 11 and two adders 12 for modulo-2 adding. The outputs of the convolution encoder, G1 and G2, may be determined by the state of the shift register and input 13. Its outputs over time points are illustrated in the form of a trellis diagram in FIG. 2.

Referring to FIG. 2 the outputs of the convolution encoder according to time points are shown. In the trellis diagram in FIG. 2, each node shows a different state that the shift register 11 may have. Each solid line branch represents the transition when the input of the shift register 11 is 0. Each dotted line branch represents the transition when input of the shift register 11 is 1. Also, the numeral of each branch represents the value of G1 and G2 when a transition in the related branch has occurred. At this moment, as two paths are overlapped in each respective state, a Viterbi decoder selects only one of the two paths which has a possibility, while the path having no possibility is discarded. In this manner, maximum likelihood decoding is carried out. The selected path is called a survivor path and each state of the survivor path preserves information for the survivor path as much as the determined decision depth or truncation depth (referred to hereinafter as "L"). Therefore, decoding is performed by selecting the greatest possibility path from among the survivor paths and tracing it back.

FIG. 3 shows a Viterbi decoder which includes a Branch Metric Unit (BMU) 22 for calculating the branch metric units between received input of the BMU 22 and a reference value of each branch in the trellis diagram of FIG. 2. An Add-Compare-Select-Unit (ACSU) 23 selects a respective survivor path at each state of the branch and calculates a state value of the survivor path. The state value is output to a Normalizing Unit (NU) 24 and a Maximum Likelihood Value Detection Unit (MLVDU) 26. The Normalizing Unit (NU) 24 subtracts the maximum branch metric value from the output of the ACSU 23. A State Metric Memory (SMM) 25 stores the calculated state value of the ACSU 23. The MLVDU 26 detects the survivor path being most possible from the respective survivor paths of each state. A Path Memory (PM) 27 stores the information for the survivor path in each state and a Traceback Unit (TU) 28 performs traceback based on values output from the MLVDU 26.

As described in FIG. 4, the TU 28 consists of a path storage 31 that stores the survivor path as much as the decision depth "L" (i.e., 0, 1, 2, . . . L-2, L-1), a multiplexer 32 and a register 33 wherein the magnitude of the register accords with K (constraint length )-1, the magnitude of the path storage is $M(=2^{K-1})*L$ (wherein M is a constant) and the multiplexer is an M:1 multiplexer.

The tracing of the TU 28 is performed using survivor path information which is pre-stored at each time unit. That is, when the survivor information of the state $m_j=a_jb_j$ at a time unit j is $s_{mj}$, a state $m_{j-1}=a_{j-1}b_{j-1}$ at a time unit j-1 of prior state on an associated survivor path is $m_{j-1}=b_js_{mj}$. At this time, since $b_j=a_j-1$ and $s_{mj}=b_j-1$ are given from the structure of the convolution encoder, the prior state in decoding is determined by detecting a state having the minimum value per each time unit and using the survivor path information stored in the path storage 27 from that state having the minimum value. This process is repeatedly performed up to the decision depth (L).

FIG. 5 shows a structure for a trellis code interleaver used in Advanced Television Systems Committee 8 Vestigial SideBand (ATSC 8VSB). The trellis code interleaver of FIG. 5 has the input stage 41 for receiving interleaved data, the output stage 43 for the output of trellis-coded and pre-coded data to a mapper (not shown) that adjusts the level to match standard transmission and twelve trellis encoders and pre-coders 42#0 through 42#11 intervened between the input stage 41 and output stage 43.

Hereinafter, operation of the trellis code interleaver will be described. Interleaved byte data from the input stage 41 is processed per byte by the twelve trellis encoders and pre-coders 42#0-42#11 being convolution encoders. One byte data generates four encoded symbol data through one encoder. One symbol data is input into the trellis encoders and pre-coders 42#0-42#11 per two bits from the most significant bit. As each byte data is encoded by means of the respective one of the trellis encoders and pre-coders 42#0-42#11, byte data of multiples of twelve is necessary for twelve trellis encoders and pre-coders 42#0-42#11. For converting byte data into symbol data, four segment unit conversions are carried out so that the byte unit is decoded into a symbol unit.

FIG. 6 shows a structure for a trellis code deinterleaver which includes an input stage 51 for receiving equalized and phase-corrected symbols, an output stage 53 for the output trellis decoded data and twelve trellis decoders 52#0-52#11 intervened between the input stage 51 and output stage 53. Here, each respective trellis decoder 52#0-52#11 has the same structure as the decoder of FIG. 3. Thus, each has the same function and operation. In addition, each respective trellis decoder 52#0-52#11 operates with each symbol clock and outputs one byte of decoded data per one symbol clock after receiving the symbol data corresponding to the decision depth "L."

As illustrated in FIG. 5, since a transmission stage of GA 8VB performs twelve symbol intra-segment interleavings, a reception stage requires twelve associated trellis decoders. However, it is noted that one symbol of the twelve symbols from the symbol sequence input into the reception stage has significant meaning in decoding.

FIG. 7 is a timing chart for a symbol clock (A), a symbol data (B), and symbol data (C–E) to be input into the respective trellis decoders. As can be seen from the drawing, each trellis decoder has a time margin up to eleven symbols between symbol data input. Therefore, each respective trellis decoder could finish traceback before input of new data thereto. For symbol clock input (ƒs), it is possible to trace data up to the decision depth L=11 for ƒs and up to the decision depth L=22 for 2ƒs. To keep Segment Error Rate below $3*16^{-10}$ at Signal-to-Ratio=10.4 dB according to Advanced Television System Committee Digital TV standards, the decision depth L=22 is preferred.

Each respective trellis decoder performs traceback for each symbol input to produce one symbol clock (two bit data). As the convolution deinterleaver associated with each trellis decoder processes input-data per byte unit, one trellis decoder must produce one byte data through four step traceback. However, tracing for each symbol input to get one byte of decoded data results in four times traceback at one byte to increase the path storage 27 in FIG. 4 by eighty-eight times. This accelerates transition frequency and increases power consumption in the Complementary Metal Oxide Semiconductor Application Specific Integrated Circuit (CMOS ASIC). Accordingly, as this increase of power consumption inevitably causes more heat to occur, particular packaging is necessary to prevent such heat, resulting in an increase in cost of ASIC manufacturing.

European Patent No. EP 0 661,840 describes a technique for decreasing the traceback length of the Viterbi decoder. The patent includes means for generating surviving branch data, storing the surviving branch data, initiating a first traceback of length "k" and initiating from the predetermined symbol an instant traceback length of k-m (m=0, 1, 2. . . k–1). Although this technique enables a decrease in traceback length, the problem of decreasing access times for path storage still remains.

BRIEF SUMMARY OF THE INVENTION

Therefore, the present invention addresses the above mentioned problems by providing a traceback device in a trellis decoder for GA VSB that enables tracing per one symbol input, as opposed to four symbol inputs in the trellis decoder, and generates one byte of decoded data through this single tracing.

More specifically, the present invention provides a traceback device for a trellis decoder including a control unit for generating an "activating signal_1" to read the survivor path stored value one time per four symbol data input and a reading address signal while generating an "activating signal_2" to delay the read survivor path stored value by means of the address signal, a traceback unit for reading the stored survivor path information according to the activating signal_1 and the address signal from the control unit and performing traceback based on the read survivor path information, and a data-delaying unit for sequentially delaying decoded data from the traceback unit up to a predetermined bit according to the activating signal _2 from the control unit resulting in an output of one byte decoded data per one time traceback.

BRIEF DESCRIPTION OF THE DRAWINGS

The invention disclosed herein will be understood better with reference to the following drawings of which.

DETAILED DISCLOSURE OF THE INVENTION

A preferred embodiment of the present invention will be described in conjunction with the attached drawings.

Figure 1:
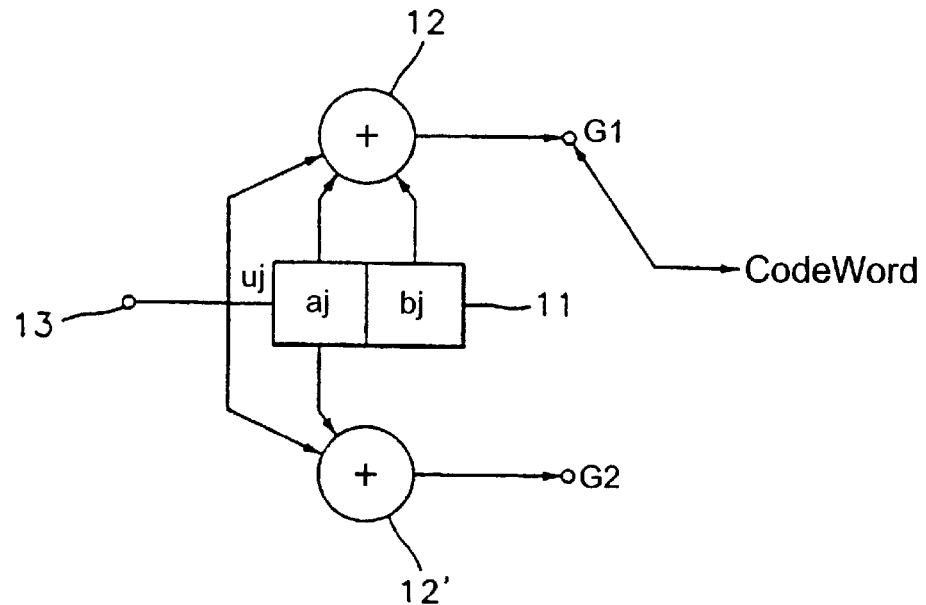
FIG. 1 is a block diagram for a general convolution decoder in the prior art.
Figure 2:
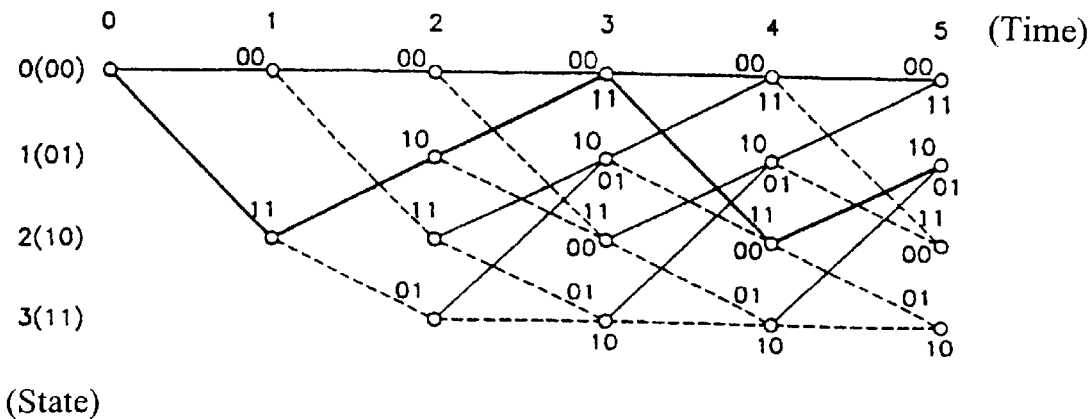
FIG. 2 is a trellis diagram for the convolution decoder in FIG. 1.
Figure 3:
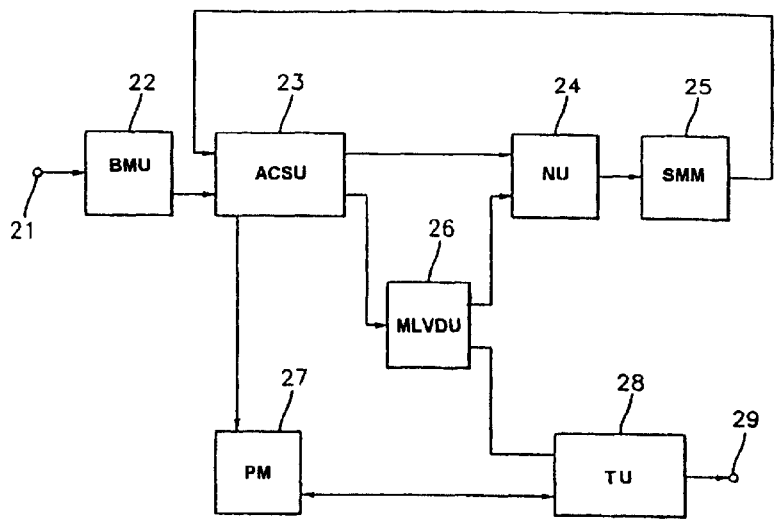
FIG. 3 is a block diagram for a Viterbi decoder using general Viterbi decoding algorithm in the prior art.
Figure 4:
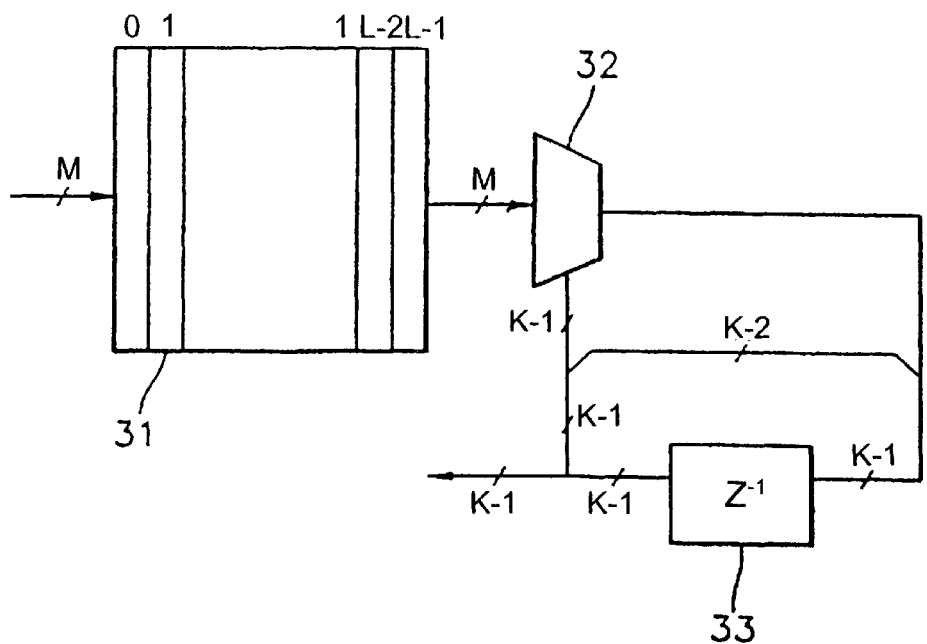
FIG. 4 is a block structure of one example of traceback device using RAM in the prior art.
Figure 5:
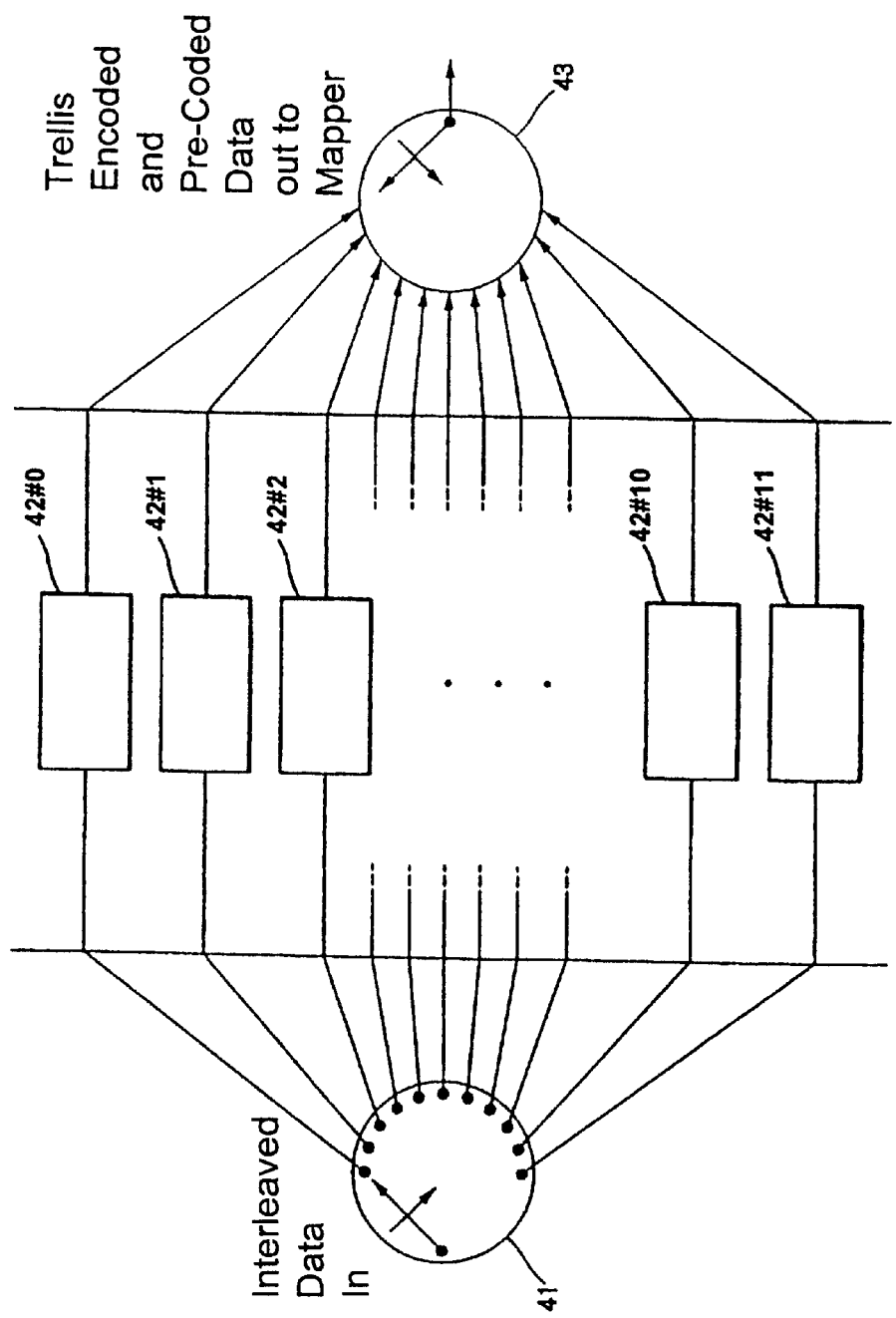
FIG. 5 is a schematic view of a trellis code interleaver including a multiple of trellis encoders in the prior art.
Figure 6:
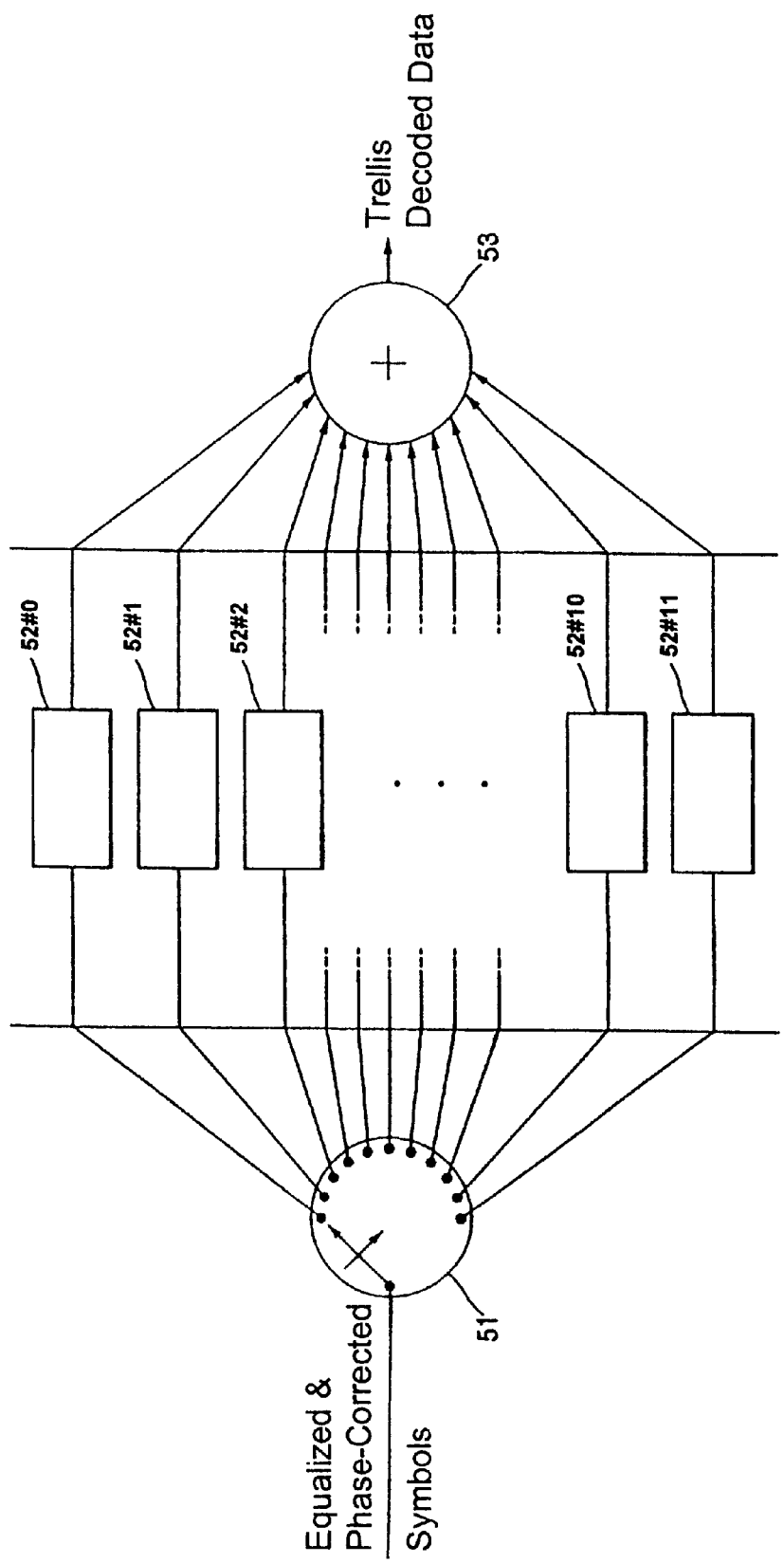
FIG. 6 is a schematic view of a trellis code de-interleaver including multiple trellis decoders as shown in the prior art.
Figure 7:
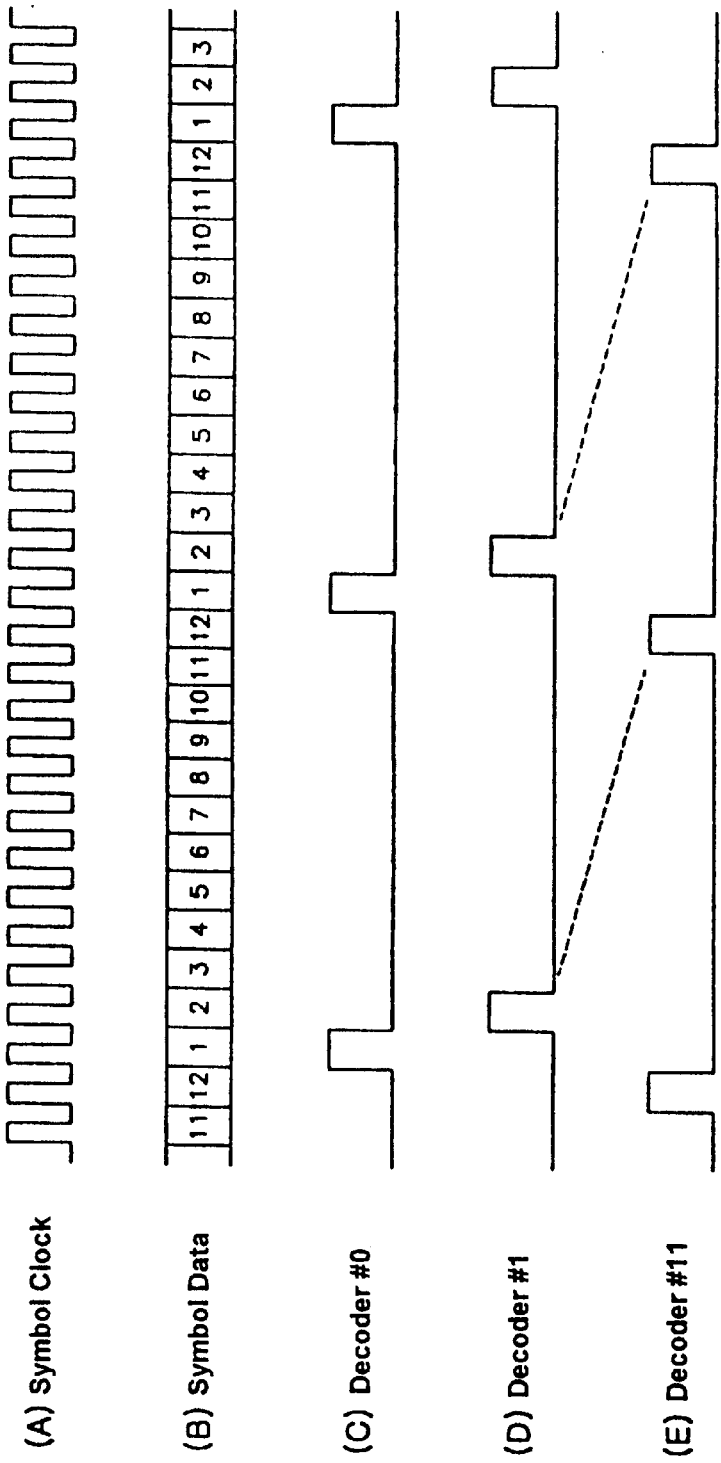
FIG. 7 is a timing chart for a symbol clock (A), a symbol data (B), and symbol data (C–E) to be input into respective trellis decoders in FIG. 6.
Figure 8:
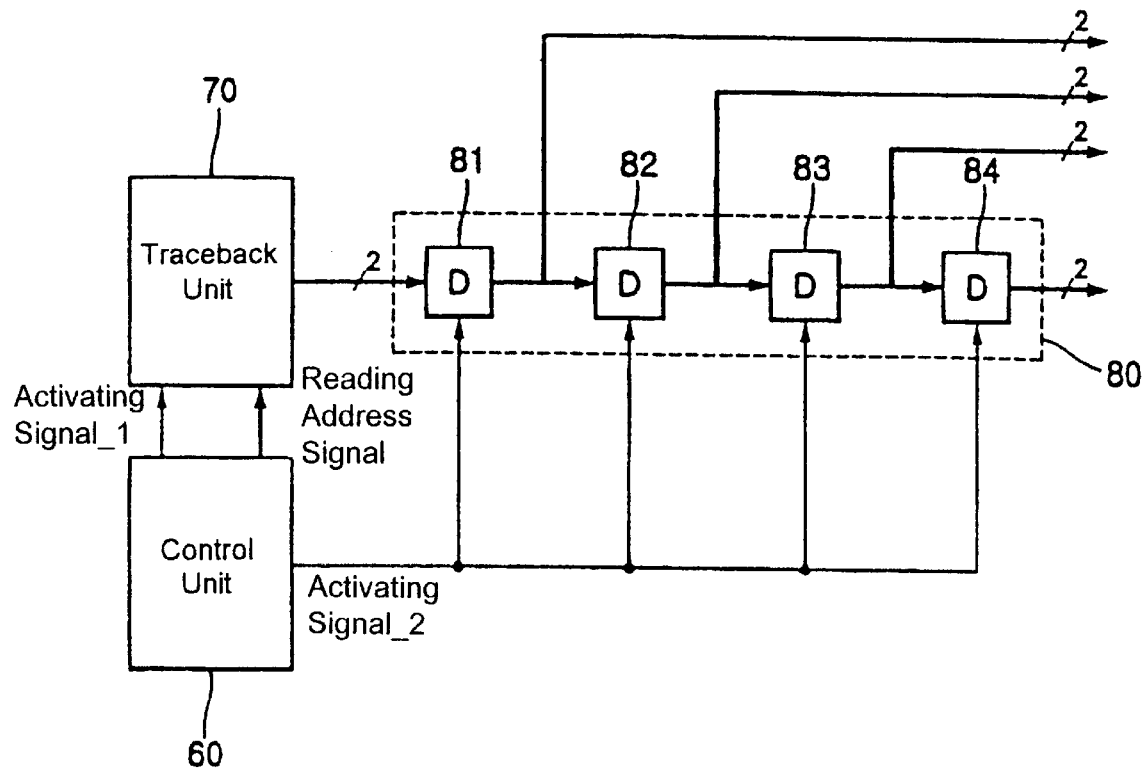
FIG. 8 is a block structure of a traceback device of a trellis decoder according to the present invention.

According to the present invention, FIG. 8 shows a block structure of a traceback device of a trellis decoder, wherein the traceback device is provided with a control unit 60, a traceback unit 70 and a delaying unit 80.

The control unit 60 generates an activating signal_1 to read survivor path stored value by one time from a survivor path storage 71 (described later) of the traceback unit 70 per four symbol data input. The control unit 60 also generates a reading address signal, while generating an activating signal_2 to delay read survivor path stored value.

The traceback unit 70 reads the survivor path information stored in the survivor path storage 71 according to the activating signal_1 and the address signal from the control unit 60. The traceback unit 70 then performs traceback based on the read survivor path information.

The data-delaying unit 80 includes a first through fourth serially connected delay elements (D) 81 to 84 which sequentially delays two bit data that is produced through traceback from the traceback unit 70 according to the activating signal_2 from the control unit 60 resulting in an output of one byte of decoded data per one time traceback.

Figure 9:
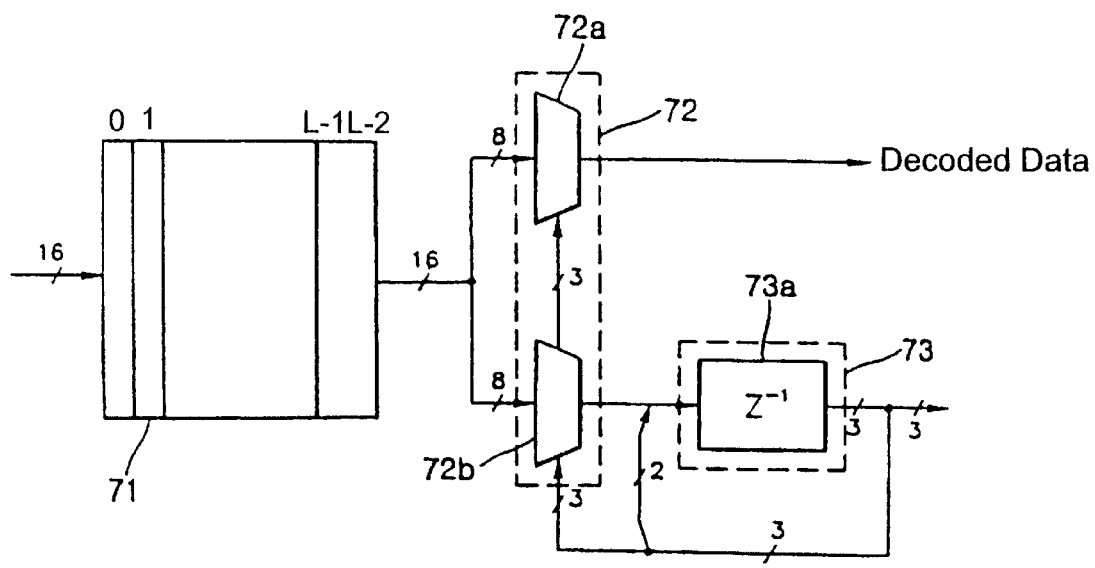
FIG. 9 is a detailed view of the traceback unit of FIG. 8.

FIG. 9 illustrates a detailed view of the traceback unit 70 of FIG. 8 which includes the path storage 71, a multiplexing unit 72 and a traceback unit 73.

The path storage 71 consists of 16*L single port RAM and stores the survivor path information up to the decision depth L (0, 1, . . ., L–1). The multiplexing unit 72 has a first multiplexer 72a which receives the upper eight bits out of the sixteen bit survivor path information from the path storage 71, multiplexes at a rate of 8:1, and outputs the information. The multiplexing unit 72 also has a second multiplexer 72b which receives the lower eight bits out of the sixteen bit survivor path information from the path storage 71, multiplexes at a rate of 8:1 and outputs the information. The traceback unit 70 includes a three bit register and outputs both the state value stored therein and the survivor path information for the decoded lower eight bits of the second multiplexer 72b.

The control unit 60 generates the reading address to access the survivor path storage 71 of the traceback unit 70 during traceback. According to this signal, the traceback unit 70 can finish one traceback up to decision depth 11<L<23 before input of next symbol data by using a symbol clock of 21.5 MHz, which is two times faster than a symbol clock of 10.7 MHz.

Figure 10:
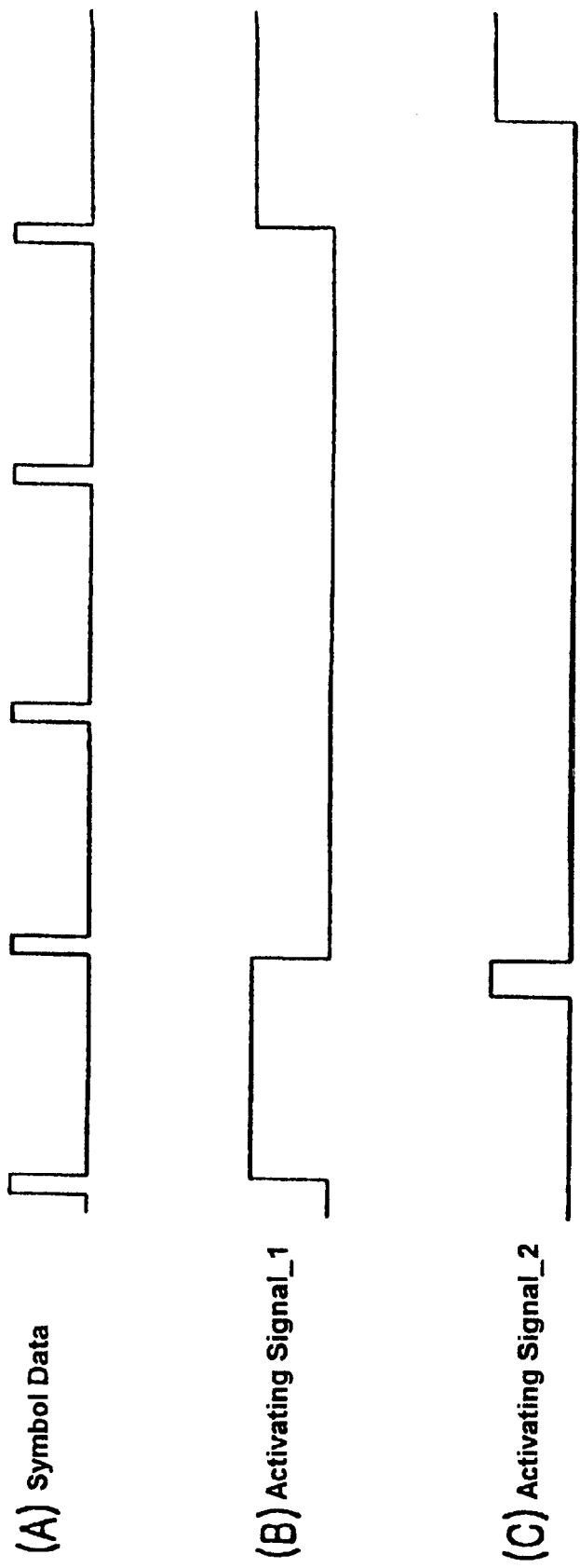
FIG. 10 is a timing chart between a symbol data and activating signals in the present invention.

The traceback process of the traceback device having construction as described above begins by way of producing activating signal__1 and activating signal __2 as shown in (B) and (C) of the timing chart of FIG. 10. This enables one traceback per four symbol inputs by virtue of a modulo-L down counter (not shown) in the control unit 60 then activating the traceback unit 70 and the data-delaying unit 80.

Here, the activating signal__1 shown in (B) of FIG. 10, which is activated one time per four symbol inputs, reads the survivor path value stored in the path storage device 71 only during the activating period and performs traceback.

The activating signal__2 shown in (C) of FIG. 10, which is activated one time per four symbol inputs, causes two-bit decoded data to be stored in each of the delaying units (D) 81–84 only during the activation period, which is the last four clock periods of the traceback. Therefore, one byte of decoded data is output per four symbol inputs and the decoded data can be maintained until the next traceback.

The traceback unit 70 outputs the survivor information stored in the L−1 address of the path storage 71 based on activation signal__1 and the address signal. At this time, the traceback unit 70 begins traceback using the state value of the three bit register 73a and the survivor information stored in the L−1 address of the path storage 71. The survivor path information stored in the path storage 71 may be given as two bit data per each state, of which the upper bit is survivor path information related to the upper bit at encoding and the lower bit is survivor path information related to the lower bit at encoding.

The sixteen bit survivor information from the path storage 71 is divided into two eight bit data, each being input into the multiplexers 72a and 72b, wherein the upper eight bits consist only of upper bit data out of the survivor information of each state to be input into the first multiplexer 72a and the lower eight bits consist only of lower bit data out of the survivor information of each state to be input into the second multiplexer 72b. Here, since the upper eight bit data was not encoded at the trellis encoder of the transmission stage, the output of the multiplexer 72a is already decoded data, while the lower eight bit data is decoded through traceback.

The input of the multiplexers 72a and 72b are determined by means of the three bit register 73a, which may also be determined by its own output and the output of the second multilplexer 72b. The second multiplexer 72b and the three bit register are a type of state machine which generate state transition per clock, which becomes the trace process. The register 73a determines the decoding output of the lower bit when the decision depth "L" has reached a final state. Further, the output of the first multiplexer 72a, according to state value of the register 73a when it has reached the final state through traceback, becomes the decoded value of the upper bit and the decoded value of the lower bit, which is determined by the combination of the final state.

Specifically, the decoded output of the lower eight bits may be determined by the states of L=19, 20, 21 and 22. The three bit register 73a sequentially accumulates states from L1 to L18. The output of the first multiplexer 72a according to state value of the register 73a when it has reached L=19 through traceback becomes the decoded value of the upper bit and the decoded value of the lower bit is determined by the combination of the state at L=19. Two bit data obtained from the above process becomes the lowest symbol of one byte data. By the same method, the next position symbol data being each two bits could be obtained through the states of L=20 and 21. Finally, through the state of L=22, the two bit upper-most symbol data is determined to produce one byte of decoded data through one traceback. The delay elements (D) 81–84, respectively, delay in sequence the two bit decoded data through traceback by means of the traceback unit 70 and output one byte of decoded data as one delay element stores two-bit symbol data.

As fully described hereinabove, the present invention enables tracing per one symbol input not four symbol inputs in the trellis decoder for GA 8VSB and generates one byte decoded data through one tracing to reduce power consumption of the CMOS ASIC with reduced tracing time. Also, the present invention allows the removal of the heat sink circuit for preventing heat due to more power consumption and thereby decreases the manufacturing cost of the ASIC.

It is further understood by those skilled in the art that the foregoing description is a preferred embodiment of the disclosed device and that various changes and modifications may be made in the invention without departing from the spirit and scope thereof.

I claim:

1. A traceback device of a trellis decoder for tracing and decoding convolution-encoded data of a transmission stage through a Viterbi decoding algorithm comprising:

control means for generating an activating signal__1 to read stored survivor path stored value one time per four symbol data inputs and a reading address signal, while generating an activating signal__2 to delay the read survivor path stored value by means of the address signal;

traceback means for reading the stored survivor path information according to the activating signal__1 and the address signal from the control means and performing traceback based on the read survivor path information, wherein the control means generates the reading address signal to read the survivor path information for traceback by the traceback means so that the traceback means finishes one traceback up to 11<L<23 before input of the next symbol data by using a symbol clock of 21.5 MHz; and data-delaying means for sequentially delaying decoded data from the traceback means as much as predetermined bit according to the activating signal__2 from the control means to output one byte decoded data per one time traceback.

2. A traceback device of a trellis decoder for tracing and decoding convolution-encoded data of a transmission stage through a Viterbi decoding algorithm comprising:

control means for generating an activating signal__1 to read stored survivor path stored value one time per four symbol data inputs and a reading address signal, while generating an activating signal__2 to delay the read survivor path stored value by means of the address signal;

traceback means for reading the stored survivor path information according to the activating signal__1 and the address signal from the control means and performing traceback based on the read survivor path information, wherein the traceback means comprises a path information storage for storing survivor path information up to a decision depth L, a multiplexing unit including two multiplexers each for multiplexing 16-bit survivor path information from the path information storage at a rate of 8:1, and a traceback unit having one input from one of the outputs of the two multiplexers and another feedback input for tracing through state transition process; and data-delaying means for sequentially delaying decoded data from the traceback means as much as predetermined bit according to the activating signal__2 from the control means to output one byte decoded data per one time traceback.

3. A traceback device of a trellis decoder, according to claim 2, wherein the traceback unit performs one traceback per four symbol inputs.

4. A traceback device of a trellis decoder, according to claim 2, wherein the path information storage comprises a single port RAM of 16*L (the decision depth) in size.

5. A traceback device of a trellis decoder, according to claim 2, wherein the survivor path information stored to the path information storage is given as 2-bit data per each state, of which the upper bit is survivor path information related to the upper bit at encoding and the lower bit is survivor path information related to the lower bit at encoding and the traceback unit is a 3-bit register.

6. A traceback device of a trellis decoder, according to claim 2, wherein one of the multiplexers is a multiplexer that multiplexes the upper 8 bit data not encoded at transmission stage out of the 16 bit survivor path information from the path information storage into a rate of 8:1 and the other multiplexer is a multiplexer that multiplexes the lower 8 bit data not encoded at transmission stage out of 16 bit survivor path information from the path information storage into a rate of 8:1.

7. A traceback device of a trellis decoder for tracing and decoding convolution-encoded data of a transmission stage through a Viterbi decoding algorithm comprising:

control means for generating an activating signal__1 to read stored survivor path stored value one time per four symbol data inputs and a reading address signal, while generating an activating signal__2 to delay the read survivor path stored value by means of the address signal;

traceback means for reading the stored survivor path information according to the activating signal__1 and the address signal from the control means and performing traceback based on the read survivor path information; and data-delaying means for sequentially delaying decoded data from the traceback means as much as predetermined bit according to the activating signal__2 from the control means to output one byte decoded data per one time traceback, wherein the data-delaying means comprises four serially connected delaying units, of which each delays in sequence 2-bit decoded data through traceback of the traceback unit and outputs one byte decoded data as one delay elements stores 2 bit symbol data.

8. A traceback device of a trellis decoder for tracing and decoding convolution-encoded data of a transmission stage through a Viterbi decoding algorithm comprising:

control means for generating an activating signal__1 to read stored survivor path stored value one time per four symbol data inputs and a reading address signal, while generating an activating signal__2 to delay the read survivor path stored value by means of the address signal;

traceback means for reading the stored survivor path information according to the activating signal__1 and the address signal from the control means and performing traceback based on the read survivor path information; and data-delaying means for sequentially delaying decoded data from the traceback means as much as predetermined bit according to the activating signal__2 from the control means to output one byte decoded data per one time traceback, wherein the activating signal__1 and the activating signal__2 are activated one time per four symbol inputs, the activating period of the activating signal__2 being the last four clock periods of the traceback and 2 bit data being stored in the data-delaying means only during the activating period.

9. A traceback device of a trellis decoder, according to claim 2, wherein the traceback unit outputs data when it arrives at the state that may output one byte decoded data for tracing of the decision depth L.

* * * * *